(12) United States Patent
Li et al.

(10) Patent No.: US 9,147,597 B2
(45) Date of Patent: Sep. 29, 2015

(54) METHOD FOR ISOLATING ACTIVE REGIONS IN GERMANIUM-BASED MOS DEVICE

(75) Inventors: Ming Li, Beijing (CN); Min Li, Beijing (CN); Ru Huang, Beijing (CN); Xia An, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/344,050

(22) PCT Filed: Jun. 14, 2012

(86) PCT No.: PCT/CN2012/076875
§ 371 (c)(1),
(2), (4) Date: Mar. 10, 2014

(87) PCT Pub. No.: WO2013/155775
PCT Pub. Date: Oct. 24, 2013

(65) Prior Publication Data
US 2015/0031188 A1    Jan. 29, 2015

(30) Foreign Application Priority Data

Apr. 18, 2012  (CN) .......................... 2012 1 0115455

(51) Int. Cl.
*H01L 21/76* (2006.01)
*H01L 21/762* (2006.01)
*H01L 21/763* (2006.01)

(52) U.S. Cl.
CPC ........ *H01L 21/76232* (2013.01); *H01L 21/763* (2013.01); *H01L 21/7621* (2013.01)

(58) Field of Classification Search
None
See application file for complete search history.

(56) References Cited

U.S. PATENT DOCUMENTS

| 5,254,873 | A  | * | 10/1993 | Poon et al. | ................ | 257/751 |
| 6,251,751 | B1 |   | 6/2001  | Chu et al.  |                  |         |
| 2007/0001163 | A1 | * | 1/2007 | Lee et al. | ................ | 257/19 |
| 2009/0001418 | A1 | * | 1/2009 | Kim et al. | ................ | 257/190 |

FOREIGN PATENT DOCUMENTS

| CN | 102227001 A | 10/2011 |
| EP | 0552671 A2  | 1/1993  |

* cited by examiner

*Primary Examiner* — David E Graybill
(74) *Attorney, Agent, or Firm* — DLA Piper LLP (US)

(57) ABSTRACT

Disclosed herein is a method for isolating active regions in a germanium-based MOS device. A surface of a germanium-based substrate is covered by a thin polysilicon layer or a poly-SiGe layer, and an isolation structure of germanium dioxide covered by a silicon dioxide layer or a SiGe oxide layer on top is formed by means of two steps of oxidation in a case of the active regions are protected. Such two steps of oxidation using the polysilicon layer or the poly-SiGe layer as a sacrificial layer is advantageous to improve the isolation quality of a fabricated germanium dioxide and to reduce a beak effect occurred during a local field oxygen oxidation so as to dramatically elevate the performance of the germanium device.

10 Claims, 3 Drawing Sheets

METHOD FOR ISOLATING ACTIVE REGIONS IN GERMANIUM-BASED MOS DEVICE

CROSS-REFERENCE TO RELATED APPLICATION

The present application is a U.S. National Stage Application of International Application No. PCT/CN2012/076875, filed Jun. 14, 2012, published as WO2013/155775A1, and claims priority to Chinese Patent Application (No. 201210115455.9) filed on Apr. 18, 2012, which are incorporated herein by reference in entirety as if set forth herein.

FIELD

The present invention refers to manufacturing technologies of ultra large scaled integrated (ULSI) circuits, and more particularly, refers to a method for fabricating an isolation structure of a germanium-based MOS device.

BACKGROUND

Under the context that a conventional silicon-based MOS device has been faced with numerous challenges and limitations, in order to further improve an operation speed of an integrated circuit, it is in urgent need of seeking a new material and/or a new device structure to change the current situation. As for a problem of mobility degradation, some channel materials having high mobility have been employed. A germanium material has obtained wide attentions on the grounds that its electron and hole mobility are greater than that of a silicon material and a fabrication process of the germanium-based device is compatible with a conventional CMOS process. Currently, however, not only that the fabrication technology of the germanium-based device has not matured yet and performance of the device is not adequately stable, but also for a large-scaled integration for the germanium-based MOS device in future, isolation for the device is a critical issue of acquiring excellent performance. However, up to now there has been no suitable material to be used in the isolation for the germanium-based device yet. In addition, an etching technology for the germanium material is also not quite stable.

SUMMARY

In order to solve the above-mentioned problems, a method for providing isolation for a germanium-based MOS device is proposed in the present invention, so that an isolation structure with better quality and stability is formed to enhance the performance of the germanium device.

A method for isolating active regions in a germanium-based MOS device according to an embodiment of the present invention includes the following steps:

1) Cleaning a germanium-based semiconductor substrate and removing a natural oxide layer on a surface thereof;
2) Passivating the surface of the substrate;
3) Depositing a polysilicon layer or a poly-SiGe layer as a sacrificial layer on the surface of the passivated substrate;
4) Depositing a silicon nitride layer on the sacrificial layer;
5) Coating a photoresist on the silicon nitride layer, defining an active region by a photolithography process and forming a mask of the photoresist above the active region;
6) Etching and removing the silicon nitride layer above an isolation region by using the photoresist as the mask, and removing the mask of the photoresist;
7) Forming an isolation structure of germanium dioxide covered by a silicon dioxide layer or an SiGe oxide layer on top by means of oxidation; and
8) Etching and removing the silicon nitride layer and the sacrificial layer above the active region.

In step 1), the germanium-based substrate may be a bulk germanium substrate or a germanium-on-insulator (GOI) substrate, and the germanium-based substrate may be a P-type doped substrate or an N-type doped substrate.

In step 1), the cleaning of the germanium-based substrate is aimed to remove organic and inorganic contaminants, metal particles and so on, on the surface of the substrate, wherein firstly an organic solvent and then a hydrochloric acid are used for the cleaning.

In step 1), a method for removing the natural oxide layer on the surface of the germanium-based substrate generally is to firstly soak the substrate in a hydrochloric acid solution of 10%-36% (a mass percentage concentration, similarly hereinafter) or a HF solution of 2%-5%, and then to rinse the substrate repeatedly by using deionized water. In a specific example of the present invention, the hydrochloric acid solution is a solution obtained by mixing a commercially-available concentrated hydrochloric acid with $H_2O$ according to a volume ratio of 1:2, and the diluted HF solution is a solution obtained by mixing a commercially-available hydrofluoric acid with H2O according to a volume ratio of 1:20.

In step 2), the substrate is soaked for a period of time in an HCl solution of 5%-10% or a $NH_4F$ solution of 20%-40% and then is rinsed repeatedly by using deionized water, so that dangling bonds of the surface of the germanium-based device are passivated.

In step 3), a deposition method at a temperature below 600° C., such as atomic layer deposition method, is preferably used to deposit the polysilicon layer or the poly-SiGe layer as the sacrificial layer, with a thickness of approximately 1 nm-5 nm.

In step 4), the silicon nitride layer may be deposited through a method such as plasma enhanced chemical vapour deposition (PECVD), low pressure chemical vapour deposition (LPCVD) or sputtering or the like. Preferably, the silicon nitride layer is deposited to a thickness of approximately 80 nm-150 nm through the PECVD.

In step 6), the silicon nitride layer is etched through a dry etching method such as reactive ion etching (RIE) or inductive coupling plasma (ICP) etching or the like by using the photoresist as the mask.

In step 7), the oxidation includes a high pressure oxidation firstly and then a low temperature oxygen atmosphere annealing. The high pressure oxidation is performed at a temperature of 300-550° C. and under a pressure of 15-25 atm for a time which is dependent on a thickness of a germanium layer needed to be oxidized. The low temperature oxygen atmosphere annealing is performed at a temperature of 200-350° C. and under a pressure of 1-3 atm for a time which is associated with the previous high pressure oxidation. Generally, the time of the low temperature oxygen atmosphere annealing is 2-5 times longer than that of the high pressure oxidation.

In step 8), the silicon nitride layer and the sacrificial layer of the polysilicon layer (or the poly-SiGe layer) above the active region are etched through reactive ion etching technology.

According to embodiments of the present invention, the surface of the germanium-based substrate is covered by the thin polysilicon layer (or the poly-SiGe layer), and then the germanium dioxide layer is formed through two steps of oxidation. Such two steps of oxidation using the polysilicon layer (or the poly-SiGe layer) as the sacrificial layer is advantageous to improve the isolation quality of the fabricated germanium dioxide and to reduce the beak effect occurred during a local field oxygen oxidation so as to dramatically improve the performance of the germanium device and to have relatively simple process steps. During the oxidation, a dense silicon dioxide or SiGe oxide layer may be firstly formed on the surface, and then the underneath germanium substrate may be oxidized by way of PPO (plasma post oxidation). In this way, no only water molecules and other contaminants can be effectively blocked form entering into the germanium dioxide layer, but also the quality and the stability of the germanium dioxide layer can be effectively enhanced.

As compared with the prior art, the present invention has the following beneficial effects.

First of all, a polysilicon layer is firstly deposited on the surface of the germanium-based substrate, and a silicon dioxide layer can be firstly formed during the oxidation so as to protect the surface of the germanium-based substrate. Second, since the silicon dioxide layer serves to protect the surface of the isolation structure of the germanium-based device, water molecules and other contaminants can be effectively blocked form entering into the germanium oxide layer, thus eliminating an issue of poor isolation effect caused by an instable problem such as that the germanium dioxide layer is soluble in water. Third, since the germanium dioxide is used for isolation in the germanium-based device, better conformity and better interface characteristic with the germanium substrate can be obtained, compared to other dielectrics for isolation. Finally, since the two steps of isolation are used, the fabricated germanium dioxide has better quality and has more stable performance. Also, the process in a way of performing firstly the high pressure oxidation and then the low temperature oxygen atmosphere annealing can reduce the problem of the "beak" effect occurred during the local field oxygen oxidation to some extent.

Figure 1:
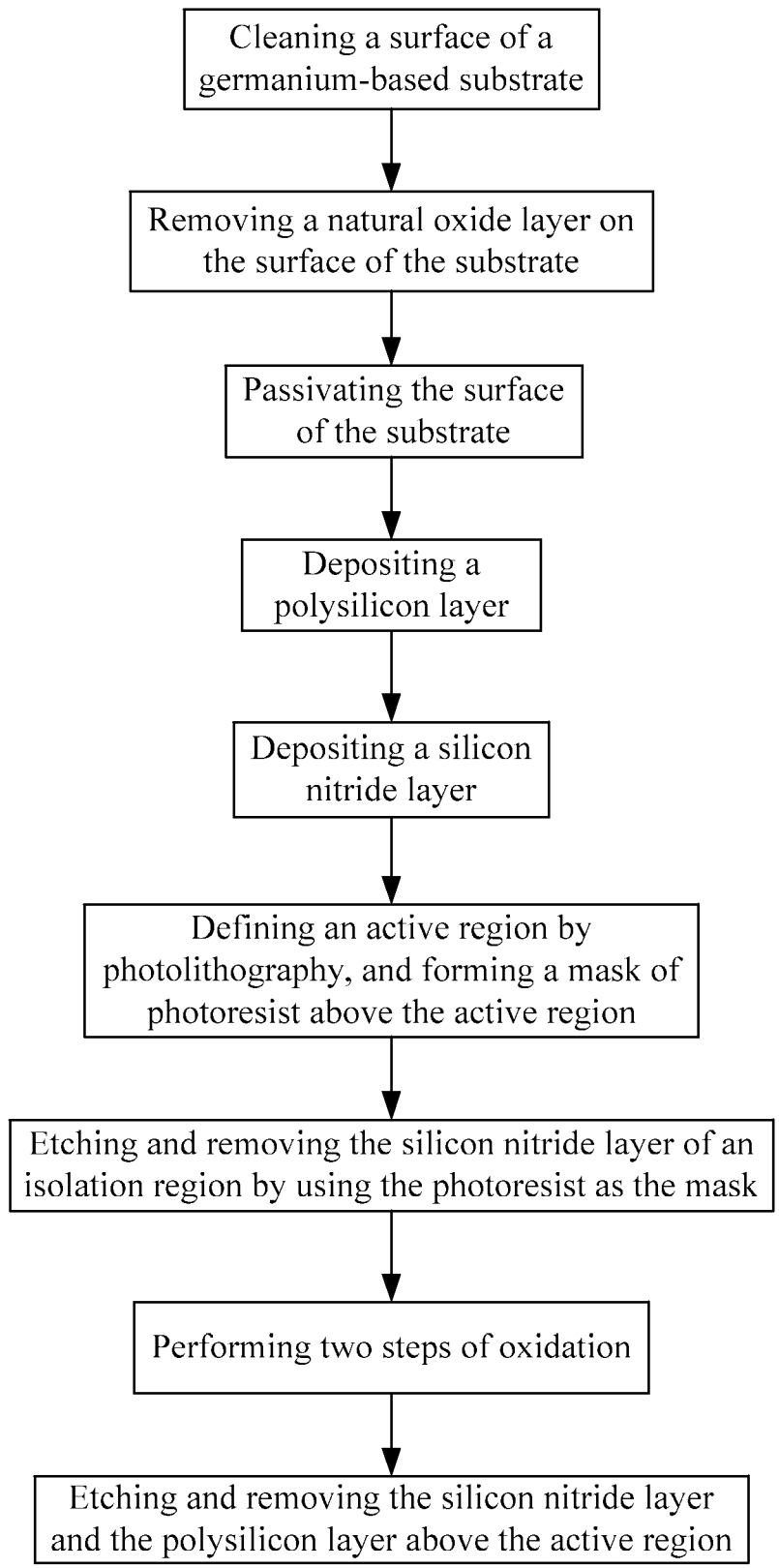
FIG. 1 is a flow chart showing a method for achieving an isolation in a germanium-based MOS device employed by an embodiment.

In the drawings: 1—a germanium substrate; 2—a polysilicon layer; 3—a silicon nitride layer; 4—a photoresist; 5—a silicon dioxide layer; 6—a germanium dioxide layer.

DETAILED DESCRIPTION OF THE EMBODIMENTS

A flow of the method according to the present invention is further described through detailed embodiments with reference to accompany drawings.

Step 1: A germanium-based substrate is provided. As shown in FIG. 2 (a), the germanium-based semiconductor substrate 1 may be a bulk germanium substrate or a germanium-on-insulator (GOD substrate or the like. The substrate may be doped as a P type or an N type.

Step 2: The substrate 1 is cleaned. Firstly, the substrate 1 is cleaned by organic solvents, in which the substrate is cleaned alternatively by acetone and ethanol twice and is rinsed repeatedly by deionized water so as to remove grease and organic contaminants on the substrate. Next, the substrate 1 is cleaned by hydrochloric acid, in which the substrate is boiled in a diluted hydrochloric acid and then is rinsed repeatedly with deionized water so as to remove inorganic contaminants, metal particles and so on. A purpose of the cleaning is to remove the organic and the inorganic contaminants, metal particles etc. on the substrate. However, it is not limited to the cleaning methods set forth above.

Step 3: A natural oxide layer on the surface of the substrate is removed. In particular, the substrate may be soaked in a concentrated hydrochloric acid solution (a mixture of a commercially-available concentrated hydrochloric acid (having a mass percentage concentration of 37.5%) with H2O according to a volume ratio of 1:2) for 10-20 seconds, and then is circularly rinsed for 10 times by using deionized water. Alternatively, the substrate may also be soaked in a diluted HF solution (a mixture of a commercially-available hydrofluoric acid (having a mass percentage concentration of 40%) with $H_2O$ according to a volume ratio of 1:20) for 20 seconds, and then is rinsed repeatedly by using deionized water.

Step 4: The surface is passivated. Generally, the substrate is soaked for 10 min-20 min in an HCl solution having a mass percentage concentration of 5%-10% or a $NH_4F$ solution having a mass percentage concentration of 20%-40% and then is rinsed repeatedly by using deionized water, so that dangling bonds of the surface of the germanium-based device are passivated.

Figure 2A:
FIG. 2(a)-FIG. 2(g) are schematic structure diagrams showing a procedure of forming an isolation structure of the germanium-based MOS device according to the embodiment.
Figure 2B:

Step 5: A polysilicon layer of approximately 1 nm is deposited on the germanium-based substrate 1 by using atomic layer deposition method or other physical vapour deposition methods. In order to ensure a good interface morphology between germanium and silicon, a temperature below 600° C. should be used. Since other methods for depositing the polysilicon layer such as LPCVD, solid phase crystallization and so on generally use a temperature above 600° C., atomic layer deposition ALD at a temperature of 450° C. is employed in an embodiment. A schematic diagram illustrating a structure after the deposition of the polysilicon layer 2 is shown in FIG. 2(b).

Figure 2C:
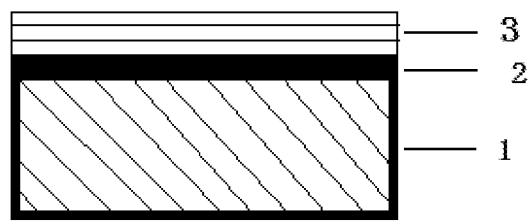

Step 6: A silicon nitride layer 3 is deposited. A method for depositing the silicon nitride layer 3 may be plasma enhanced chemical vapour deposition (PECVD), low pressure chemical vapour deposition (LPCVD), sputtering or the like. A PECVD method is preferably used in an embodiment. At a temperature of 250-500° C., the silicon nitride layer 3 of 50-150 nm, preferably 100 nm in the embodiment, is deposited on the polysilicon layer 2 by using the PECVD method, as shown in FIG. 2(c).

Figure 2D:
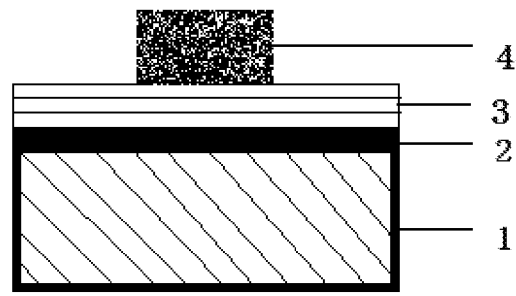

Step 7: An active region is defined through photolithography. A standard photolithography process is used. FIG. 2(d) shows a schematic diagram illustrating a structure after photolithography, in which a photoresist 4 covers the active region.

Step 8: The silicon nitride layer 3 of 100 nm is etched through reactive ion etching RIE by using the photoresist 4 as a mask. A dry etching method such as ICP or the like may also be used.

Figure 2E:
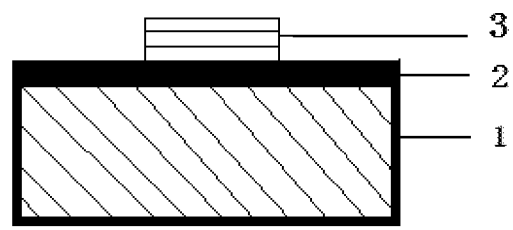

Step 9: A dry photoresist stripping process is performed for approximately 10 min firstly, and then an ultrasonic cleaning process using acetone at 100W for 10 min is performed, so that the photoresist 4 is completely removed off. A schematic diagram is shown in FIG. 2(e).

Figure 2F:
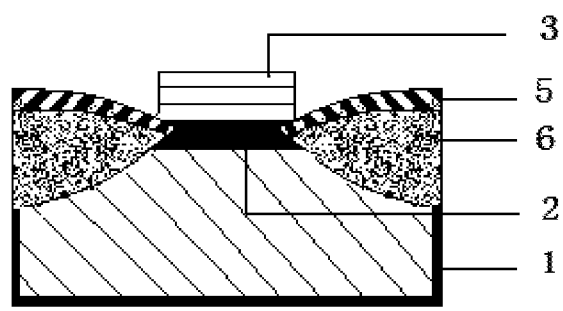

Step 10: Two steps of oxidation are performed. Firstly, a high pressure oxidation is performed at a temperature of 300-550° C. and under a pressure of 15-25 atm for a time which is dependent on a thickness of a germanium layer needed to be oxidized. Secondly, a low temperature oxygen atmosphere annealing is performed at a temperature of 200-350° C. and under a pressure of 1-3 atm for a time which is associated with the time taken for the previous high pressure oxidation. In a specific example, the high pressure oxidation is performed at 400° C. for 15 min, and the low temperature oxygen atmosphere annealing is performed at 250° C. for 30 min. A process of the high pressure oxidation in combination with the low temperature oxygen atmosphere annealing can reduce a problem of a "beak" effect occurred during a local oxidation to some extent. After the oxidation, a silicon dioxide layer 5 and a germanium dioxide 6 are formed in the isolation region, as shown in FIG. 2(f).

Figure 2G:
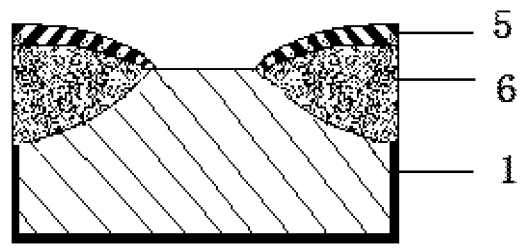

Step 11: As shown in FIG. 2(g), the silicon nitride layer 3 and the polysilicon layer 2 are etched through a reactive ion etching technology so as to form the active region. Devices can be fabricated within the active region.

Embodiments of the present invention provide a germanium dioxide of stable performance used as an isolation layer in a germanium-based device. The fabrication method thereof according to the present invention has been described in detail with reference to preferable embodiments. However, it should be understood by those skilled in the art that, the embodiments mentioned above is only preferable embodiments of the present invention, and the processes of the present invention may be modified and changed without departing from the substantial scope of the present invention. For instance, poly-SiGe is used as a sacrificial layer, and an ozone oxidation process is used.

What is claimed is:

1. A method for isolating active regions in a germanium-based MOS device, comprising the following steps:
   1) Cleaning a germanium-based semiconductor substrate and removing a natural oxide layer on a surface of the substrate;
   2) Passivating the surface of the substrate;
   3) Depositing a polysilicon layer or a poly-SiGe layer as a sacrificial layer on the surface of the substrate;
   4) Depositing a silicon nitride layer on the sacrificial layer;
   5) Coating a photoresist on the silicon nitride layer, defining an active region through a photolithography process, and forming a mask of the photoresist above the active region;
   6) Etching and removing the silicon nitride layer above an isolation region by using the photoresist as the mask, and removing the mask of the photoresist;
   7) Forming an isolation structure of germanium dioxide covered by a silicon dioxide layer or an SiGe oxide layer on top by means of oxidation; and
   8) Etching and removing the silicon nitride layer and the sacrificial layer above the active region.

2. The method according to claim 1, characterized in that, in step 1), the germanium-based substrate is a bulk germanium substrate or a germanium-on-insulator substrate.

3. The method according to claim 1, characterized in that, in step 1), a method for removing the natural oxide layer on the surface of the substrate is: soaking the substrate in a hydrochloric acid solution having a mass percentage concentration of 10%-36% or a HF solution having a mass percentage concentration of 2%-5%, and repeatedly rinsing the substrate by using deionized water.

4. The method according to claim 1, characterized in that, in step 2), the substrate is soaked in a HCl solution having a concentration of 5%-10% or a $NH_4F$ solution having a mass percentage concentration of 20%-40%, and then is rinsed repeatedly by using deionized water.

5. The method according to claim 1, characterized in that, in step 3), the polysilicon layer or the poly-SiGe layer is deposited by using an atomic layer deposition method at a temperature below 600° C.

6. The method according to claim 1, characterized in that, in step 3), the sacrificial layer has a thickness of 1 nm-5 nm.

7. The method according to claim 1, characterized in that, in step 4), the silicon nitride layer is deposited through a plasma enhanced chemical vapour deposition method, a low pressure chemical vapour deposition method or a sputtering method.

8. The method according to claim 1, characterized in that, in step 4), the deposited silicon nitride layer has a thickness of 80 nm-150 nm.

9. The method according to claim 1, characterized in that, in step 7), a high pressure oxidation at a temperature of 300-550° C. and under a pressure of 15-25 atm is performed firstly, and then a low temperature oxygen atmosphere annealing at a temperature of 200-350° C. and under a pressure of 1-3 atm is performed.

10. The method according to claim 1, characterized in that, in step 8), the silicon nitride layer and the sacrificial layer above the active region are etched through reactive ion etching technology.

* * * * *